US008461913B2

(12) United States Patent
Garrard et al.

(10) Patent No.: US 8,461,913 B2
(45) Date of Patent: Jun. 11, 2013

(54) INTEGRATED CIRCUIT AND A METHOD FOR SELECTING A VOLTAGE IN AN INTEGRATED CIRCUIT

(75) Inventors: Michael Garrard, Chelmsford (GB); Daniel Ziegler, Houston, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 796 days.

(21) Appl. No.: 12/067,594

(22) PCT Filed: Sep. 21, 2005

(86) PCT No.: PCT/EP2005/010316

§ 371 (c)(1),
(2), (4) Date: Jul. 18, 2008

(87) PCT Pub. No.: WO2007/038944

PCT Pub. Date: Apr. 12, 2007

(65) Prior Publication Data

US 2009/0027018 A1 Jan. 29, 2009

(51) Int. Cl.

| | |
|---|---|
| ***G05F 1/10*** | (2006.01) |
| ***G05F 3/02*** | (2006.01) |
| ***G05F 1/00*** | (2006.01) |
| ***G05F 3/04*** | (2006.01) |
| ***G05F 3/08*** | (2006.01) |
| ***G11C 5/14*** | (2006.01) |

(52) U.S. Cl.
USPC ...... 327/540; 327/541; 365/189.09; 323/274; 323/312

(58) Field of Classification Search
USPC ................. 323/273, 281, 303, 241, 268–272, 323/274, 312; 234/76.17; 327/78, 538, 540–543; 330/10; 341/78; 365/226, 189.09
See application file for complete search history.

(56) References Cited

U.S. PATENT DOCUMENTS

| | | | | |
|---|---|---|---|---|
| 3,705,316 A * | 12/1972 | Burrous et al. | ............... | 327/513 |
| 5,231,316 A * | 7/1993 | Thelen, Jr. | ..................... | 327/103 |
| 5,309,399 A * | 5/1994 | Murotani | ................. | 365/189.09 |
| 5,467,009 A * | 11/1995 | McGlinchey | ................. | 323/269 |
| 5,497,119 A * | 3/1996 | Tedrow et al. | ................ | 327/540 |
| 5,689,460 A * | 11/1997 | Ooishi | ..................... | 365/189.07 |
| 5,790,469 A * | 8/1998 | Wong | ............................ | 365/226 |
| 5,917,311 A * | 6/1999 | Brokaw | ........................ | 323/280 |
| 6,037,889 A * | 3/2000 | Knee | ............................. | 341/154 |
| 6,603,280 B2 * | 8/2003 | Notohara et al. | ............. | 318/500 |
| 6,653,999 B2 * | 11/2003 | Motegi et al. | ................ | 345/100 |
| 6,683,494 B2 * | 1/2004 | Stanley | ........................... | 330/10 |
| 6,690,152 B2 * | 2/2004 | Smith | ........................ | 324/76.17 |
| 7,068,019 B1 * | 6/2006 | Chiu | ............................. | 323/281 |
| 7,102,342 B2 * | 9/2006 | Kim | .............................. | 323/316 |
| 7,212,067 B2 * | 5/2007 | Pasternak | ...................... | 327/541 |
| 2001/0017595 A1 * | 8/2001 | Cliff et al. | ........................ | 341/78 |
| 2003/0098680 A1 * | 5/2003 | Umemoto et al. | ............ | 323/313 |
| 2004/0124909 A1 * | 7/2004 | Haider et al. | ................. | 327/540 |
| 2005/0141317 A1 * | 6/2005 | Kim et al. | ..................... | 365/226 |

FOREIGN PATENT DOCUMENTS

| | | |
|---|---|---|
| JP | 2000148264 A | 5/2000 |
| JP | 2001216040 A | 8/2001 |

* cited by examiner

*Primary Examiner* — Adolf Berhane
*Assistant Examiner* — Gary Nash

(57) ABSTRACT

An integrated circuit comprising an adjustable voltage source to allow a plurality of voltage values to be selected; means for measuring a voltage value derived from the adjustable voltage source; and means for configuring the adjustable voltage source to provide a selected voltage value, wherein the selected voltage value is selected based upon a voltage value measured by the means for measuring and a voltage selected by a controller.

20 Claims, 2 Drawing Sheets

INTEGRATED CIRCUIT AND A METHOD FOR SELECTING A VOLTAGE IN AN INTEGRATED CIRCUIT

FIELD OF THE INVENTION

The present invention relates to an integrated circuit and a method for selecting a voltage in a integrated circuit.

BACKGROUND OF THE INVENTION

To allow faster operation, reduce cost and improve the power consumption of electronic devices, and in particular mobile electronic devices, integrated circuits are continuiglu being designed to operate on lower and lower voltages.

To minimise cost and avoid the need to redesign all elements within an electronic device integrated circuits are sometimes designed to include a regulator. This is to allow an integrated circuit that is arranged to operate on a first voltage to be coupled to a power supply operating at a higher second voltage. Consequently, this allows electronic devices to be upgraded with new integrated circuits without the need to replace the electronis devices existing power supply.

However, with the large range of different silicon technologies and associated operating voltages it can still be costly to have to design a range of different regulators, where different regulators are used with different integrated circuits and power supplies.

One way to avoid this problem has been via the use of programmable voltage supplies, where supply voltages are adjusted to provide a required voltage, one example of this technique is described in U.S. Pat. No. 5,790,469. However, this technique requires the use of an external voltage reference to allow the programmable voltage supply to determine an appropriate voltage, which yet again will typically result in an increase in complexity and cost of a device.

Further, as the operating voltage of integrated circuits continue to reduce it also becomes increasingly difficult to achieve the required voltage tolerances, for example a three percent tolerance on a one volt signal is a factor of ten less than a three percent tolerance on a ten volt signal.

For proper operation of an integrated circuit the voltage supply should ideally be monitored for variations of voltage outside the operating voltage range of the integrated circuit. Additionally, to avoid incorrect operation and possibly damage to an electronic module the monitoring circuit typically resets the integrated circuit on occations when voltage excursions occur outside the operating voltage range of the integrated circuit. However, for an electronic device with a new integrated circuit a monitoring circuit associated with the power supply will typically be unaware of the operating voltage range of the newly incorporated integrated circuit.

Further, as the testing of an integrated circuit will typically require operating the integrated circuit outside its normal operating voltage range any monitorint circuits will need to be disabled prior to testing to avoid the resetting of the integrated circuit. However, for safety related systems to include a mechanism to disable supply monitoring can be hazardous as it would be possible for the supply monitoring to be disable undesirably during normal operation.

Accordingly, it is desirable to improve this situation.

SUMMARY OF THE INVENTION

In accordance with an aspect of the present invention there is provided an integrated circuit and method for selecting a voltage in an integrated circuit according to the accompanying claims.

This provides the advantage of allowing a integrated circuit to be designed for use with a variety of different power supplies without different regulators being required. Further, this allows the voltage for an integrated circuit to be monitored during testing of the integrated circuit without the resetting of the integrated circuit occurring for excursions of voltage outside the integrated circuits operating voltage range while also maintaining a default initial status of correct supply monitoring. This also allows voltage tolerances supplied to an integrated circuit to be improved and consequently could allow an increase in yield of integrated circuits, and fine tuning of operating voltage as best suits the integrated circuit.

BRIEF DESCRIPTION OF THE DRAWINGS

An embodiment of the invention will now be described, by way of example, with reference to the drawings, of which.

DETAILED DESCRIPTION OF THE PREFERRED EMBODIMENT

A first embodiment of the present invention is described with reference to FIG. 1, where a control loop 101 on an integrated circuit 100 is arranged to select a voltage for regulating the voltage supply for the integrated circuit 100.

Figure 1:
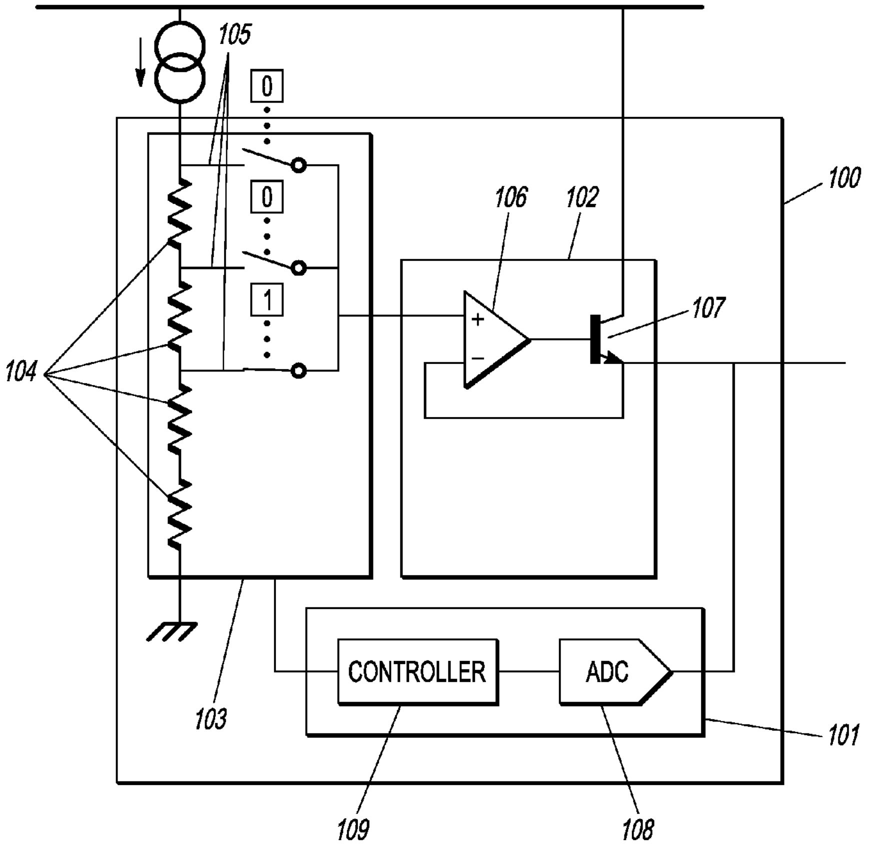
FIG. 1 illustrates an integrated circuit according to a first embodiment of the present invention.

As shown in FIG. 1 the integrated circuit 100 includes the control loop 101, where the control loop 101 is coupled between an output from a regulator 102 and a control input of a selectable voltage source 103. The control loop 101 is arranged to select a voltage for the integrated circuit 100 using the selectable voltage source 103.

The selectable voltage source 103 comprises a series of resistors 104 couple between a reference voltage, for example ground, and a second reference voltage, for example from a supply power line. Accordingly, the series of resistors act as voltage dividers between the two reference voltages. However, as would be appreciated by a person skilled in the art other techniques for providing a selectable voltage source can be provided. Further, while the power supply will be external to the integrated circuit the second reference voltage may be derived on the integrated circuit from the power supply voltage, for example from the collector of a transistor (not shown).

Coupled between the series of resistors 104 are electrical taps 105, where each electrical tap 105 includes a switch to allow selection of a voltage associated with the coupling position of the electrical tap 105 with respect to the series of resistors 104. As such, a different voltage point along the voltage gradient formed by the series of resistors 104 is selectable by the respective electrical taps. Accordingly, a required voltage is selected using the selectable voltage source 103. In the embodiment shown in FIG. 1 the voltage selected is the target output voltage of regulator 102.

The voltage selected using the selectable voltage source 103 will depend upon the reference voltages and the configuration of resistors formed in the series of resistors 104 and the number and configuration of electrical taps 105. A voltage selected by an electric tap switch is provided to an output of the selectable voltage source (i.e. the electric tap switch couples the selectable voltage source output to the appropriate voltage point on the series of resisters 104).

Although, FIG. 1 shows four resistors 104 in series and three electrical taps 105, as would be appreciated by a person skilled in the art the selectable voltage source 103 could be configured with any number of resistors and/or electrical taps. Additionally, alternative mechanisms of providing a selectable voltage might also be used, such as the use of voltage not current reference, or the use of a variable element such as resistance of a transistor, or variable voltage gain with a fixed primary reference.

The regulator 102 is for regulating the voltage supply to the integrated circuit 100, as is well known to a person skilled in the art.

Although any suitable form of regulator 102 could be used, for the purposes of the present embodiment the regulator 102 includes a differential amplifier 106 and an NPN transistor 107. Although the NPN transistor 107 is shown to be part of the integrated circuit 100, sometimes the NPN transistor will be instantiated externally to the integrated circuit 100. Further, any suitable transistor could be used, for example a PNP transistor or FET.

An output from the selectable voltage source 103 is coupled to a non-inverting input of the differential amplifier 106, an output from the differential amplifier 106 is coupled to the base of the NPN transistor 107 and an inverting input of the differential amplifier 106 is coupled to the emitter of the NPN transistor 107, where the emitter output of the NPN transistor 107 acts as the regulated voltage source for the integrated circuit 100. The collector of the NPN transistor 107 is coupled to the supply power line.

As is well known to a person skilled in the art the regulator 102 is arranged to maintain a constant voltage based on the input voltage applied at the non-inverting input of the differential amplifier 106.

The control loop 101 is arranged to measure the regulated voltage at the output of the regulator 102, which for the purposes of the present embodiment is the output from the emitter of the NPN transistor 107, and, based upon a required predetermined voltage, is arranged to set an appropriate electric tap 105 switch to select an appropriate voltage for outputting from the selectable voltage source 103 to the non-inverting input of the differential amplifier 106.

The control loop 101 includes an analogue to digital converter 108 ADC and a controller 109. The ADC 108 is arranged to sample the regulated voltage at the output of the regulator 102 and provide the sampled digital representation of the regulated voltage to the controller 109. Ideally the ADC 108 will have a resolution and accuracy equal to or greater than that of the selectable voltage source 103.

Based upon the measured voltage-information received by the controller 109 from the ADC 108 and predetermined voltage information stored in memory (not shown) of the controller 109, the controller 109 determines whether the regulated voltage at the output of the regulator 102 needs to be modified. If the regulated voltage at the output of the regulator 102 does not correspond with the predetermined voltage information stored in the controller 109, the controller 109 makes a determination as to the voltage that should be provided to the non-inverting input of the differential amplifier 106 and sets the appropriate electric tap switch of the selectable voltage source 103 to allow the appropriate voltage to be provided from the selectable voltage source 103 to the non-inverting input of the differential amplifier 106.

The operation of the controller 109 may be programmable. Examples of the type of actions that the controller 109 may be configured to perform include:

1) determining that the regulated voltage is too low for optimum operation of the integrated circuit and cause the selected voltage to increase, for example using predetermined information relating to voltage taps, alternatively performing iterative increases in voltage;
2) determining, based on other information received by the integrated circuit, that the voltage should be reduced to reduce power consumption;
3) determining, based on other information, that the integrated circuit is in a test mode and that a voltage monitoring threshold should be reduced;
4) based on known characteristics of the regulator the controller 109 could be arranged to raise voltage supply to provide increased supply voltage margin for correct operation of the integrated circuit;
5) determine, based on information in memory, that the integrated circuit is used in a safety critical application and that a voltage monitor threshold should be adjusted closer to the operational limits of the integrated circuit;
6) determine, based on a previous measurement stored in non-volatile memory, that the regulator voltage should be adjusted.

The controller 109 could be any suitable form of processing device, for example a microcontroller, logic element or a digital signal processor DSP. It will also be appreciated by a person skilled in the art that the entire feedback path, which includes the ADC 108, the controller 109 and voltage adjustment, can be replaced by dedicated circuitry. The advantage of an ADC 108 and a microprocessor core, which acts as the controller 109, is that such features typically exist in combination on many existing integrated circuits.

As the ADC 108 samples the regulated voltage supply on the integrated circuit this allows an increase in accuracy of voltage measurement and consequently allows a more accurate selection of voltage to be provided to the regulator 102 from the selectable voltage source 103.

Although, as described above, the voltage information is stored in controller memory, equally the voltage information could be stored in memory external to the controller 109. Typically the voltage information will be stored in memory in binary form.

As such, when supply power voltage is provided to the integrated circuit 100 the controller 109 identifies the presence of regulated voltage at the output of the regulator 102 and based upon the predetermined voltage information stored in the controller 109, the controller 109 will cause the regulated voltage provided by the regulator 102 to self adjust dynamically to the required regulated voltage by the controller 109 selecting an appropriate electric tap switch of the selectable voltage source 103 to allow the desired voltage to be provided to the non-inverting input of the differential amplifier 106. Consequently, the control loop 101 will allow the regulated voltage provided by the regulator 102 to self adjust as predetermined by the instructions or operation of the controller 109.

A second embodiment of the present invention is described with reference to FIG. 2, where the same features as shown in FIG. 1 have the same reference numerals. The second embodiment of the present invention is based on a control loop 101 that is configured to select a voltage for controlling the supply voltage range over which an integrate circuit 200 is arranged to operate.

Figure 2:
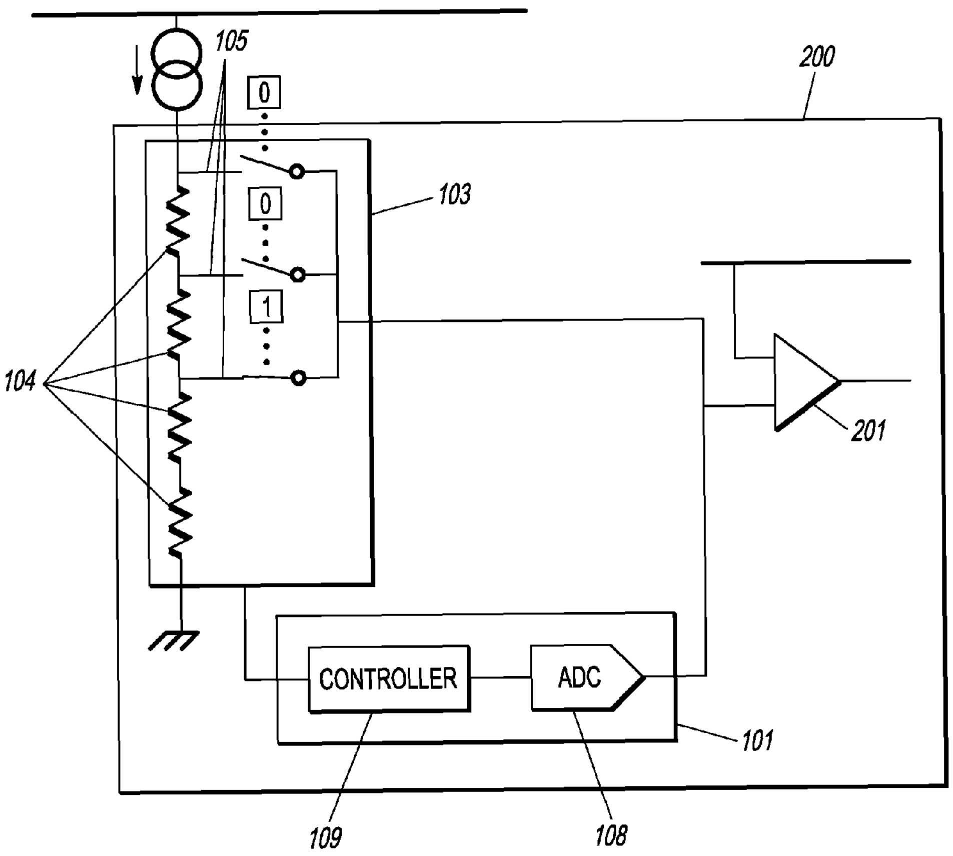
FIG. 2 illustrates an integrated circuit according to a second embodiment of the present invention.

As shown in FIG. 2 the integrated circuit 200 includes the control loop 101, where the control loop 101 is coupled to a first input of a comparator 201 and a control input of the selectable voltage source 103. The control loop 101 and first input of the comparator are also coupled to an output from a selectable voltage source 103.

A second input of the comparator 201 is coupled to the integrated circuits voltage supply, which will typically be regulated. An output of the comparator 201 is coupled to a reset line for the integrated circuit, which when set high will place the integrated circuit in a reset condition.

The comparator 201 is arranged to compare the voltage output from the selectable voltage source 103, which is received at the comparators first input, with the integrated circuits voltage supply, which is received at the comparators second input. Upon the comparator 201 detecting that the integrated circuits voltage supply is below the output voltage from the selectable voltage source 103 the comparator 201 is arranged to set its output high and consequently place the integrated circuit 200 in a reset condition.

As the control loop 101 is able to select an appropriate output voltage from the selectable voltage source 103 it is possible for the control loop to dynamically define the operating voltage range for the integrated circuit 200. Further, by allowing the control loop 101 to select different output voltages from the selectable voltage source 103 the control loop 101 can be configured, as described below, to select an appropriate operating range for the integrated circuit 200 during normal operation of the integrated circuit 200 to minimise risk of erroneous operation while also allowing the possibility of extending the operating voltage range of the integrated circuit 200 to allow testing of the integrated circuit 200 with an extended operating voltage range, while still providing protection to the integrated circuit should large fluctuations in the integrated circuit voltage supply occur.

As with the previous embodiment the selectable voltage source 103 comprises a series of resistors 104 couple between a first reference voltage, for example ground, and a second reference voltage, for example a supply power line. Accordingly, the series of resistors 104 act as voltage dividers between the two reference voltages.

Coupled between the series of resistors 104 are electrical taps 105, where each electrical tap 105 includes a switch to allow selection of a voltage associated with the coupling position of the electrical tap 105 with respect to the series of resistors 104. As such, a different voltage point along the voltage gradient formed by the series of resistors 104 is selected by the respective electrical taps. Accordingly, a voltage is selected using the selectable voltage source 103 by closing an appropriate electrical tap switch at the voltage point along the voltage gradient formed by the series of resistors 104 corresponding to the voltage required. The voltages selectable using the selectable voltage source 103 will depend upon the difference in voltage between the first reference voltage and the second reference voltage and the configuration of resistors formed in the series of resistors 104 and the number and configuration of electrical taps 105.

Although, FIG. 2 only shows four resistors 104 in series and three electrical taps 105, as would be appreciated by a person skilled in the art the selectable voltage source 103 could be configured with any number of resistors and/or electrical taps.

The control loop 101 includes an ADC 108 and a controller 109. The ADC 108 is arranged to sample the output voltage from the selectable voltage source 103, which is provided to the first input of the comparator 201. The ADC 108 is arranged to provide the sampled digital representation of the voltage from the selectable voltage source 103 to the controller 109, where as described above the controller 109 can control the output voltage of the selectable voltage source 103 as required.

For the purpose of the present embodiment the controller 109 is programmed to allow one of two voltages to be output from the selectable voltage source. The first allowable output voltage from the selectable voltage source 103 corresponds to the minimum operating voltage of the integrated circuit 200 during normal operation. The second allowable output voltage from the selectable voltage source 103 corresponds to the minimum operating voltage of the integrated circuit during testing of the integrated circuit, where the second allowable output voltage is lower than the first allowable output voltage.

If the controller 109 is configured to allow the integrated circuit 200 to operate under normal operating conditions the controller 109 sets the appropriate electric tap switch for allowing the first allowable output voltage to be output from the selectable voltage source 103 to the first input of the comparator 201. As such, if the integrated circuits supply voltage goes below the first allowable voltage the comparator 201 will set is output high and place the integrated circuit 200 in a reset condition until the integrated circuits supply voltage increases above the first allowable voltage. To avoid the integrated circuit oscillating between an operational condition and a reset condition some form of hysterisis could be adopted.

If testing of the integrated circuit 200 is required the controller 109 can be placed in a test mode that causes the controller 109 to set the appropriate electric tap switch for allowing the second allowable output voltage to be output from the selectable voltage source 103 to the first input of the comparator 201. Consequently, this allows the operating voltage range of the integrated circuit 200 to be lowered to the second allowable voltage, thereby allowing extended testing of the integrated circuit 200. This permits testing at below normal operating voltage and ensures highly reliable operation of the integrated circuit over its normal operating voltage range. Through use of the invention, the reset monitor is never fully disabled, which is advantageous to a safety critical system. As such, if the integrated circuits supply voltage goes below the second allowable voltage the comparator 201 will set is output high and place the integrated circuit 200 in a reset condition until the integrated circuits supply voltage increases above the second allowable voltage. To avoid the integrated circuit oscillating between an operational condition and a reset condition some form of hysteresis could be adopted.

Although the controller 109 has been described as allowing the generation of two output voltages from the selectable voltage source 103, the controller 109 can be configured to select any number of voltages from the selectable voltage source 103. For example, in addition to the controller 109 being programmed with two operating modes, the controller 109 could be programmed with a safety critical mode, which allows the controller 109 to be configured to control the selectable voltage source 103 to output a third allowable output voltage that is higher than the first allowable output voltage, thereby narrowing the operating voltage range of the integrated circuit 200 which may be appropriate for safety critical devices, where the comparator would cause the integrated circuit 200 to reset if the integrated circuits voltage supply went below the third allowable output voltage. In operation the third allowable output voltage might be approached iteratively, whereby the current reset voltage is stored in a non-volatile manner that persists over a reset condition. The reset threshold might be increased fractionally, and if no reset occurs the new threshold would again be stored as a known good operating voltage. In this way the actual operating voltage range of the integrated circuit and supply can be established, and the controller could then set a suitable threshold for continuous operation as suits a safety critical system. It would be appreciated by a person skilled in the art that such an embodiment of the invention would use a multitude of voltage taps.

In addition to the adjustable setting of the lower allowable operating voltage for the integrated circuit 200, equally the same approach could be used to alternatively or additionally set the higher allowable operating voltage for the integrated circuit 200. Whereas operating voltages lower than required are always encountered when the power supply to the integrated circuit is switched off, operating voltages higher than allowable are often indicative of a fault condition. Consequently, safety critical systems should monitor for such conditions.

As such, the control loop for selecting a voltage for an integrated circuit can be used for selecting a voltage for an integrated circuit for a variety of different purposes.

It will be apparent to those skilled in the art that the disclosed subject matter may be modified in numerous ways and may assume embodiments other than the preferred forms specifically set out as described above, for example the control loop 101 could be configured to provide the functionality described in the first and second embodiments within the same integrated circuit and/or the comparator 201 in the second embodiment could be configured to reset the integrated circuit 200 by setting its output low.

The invention claimed is:

1. An integrated circuit comprising:

an adjustable voltage source to allow a plurality of voltage values to be selected;

a control loop to measure a voltage value derived from the adjustable voltage source; and a controller to set one of a plurality of switches of the adjustable voltage source to configure the adjustable voltage source to provide a selected voltage value, wherein the selected voltage value is selected in response to setting the one of the plurality of switches based upon the voltage value measured by the control loop and a predetermined voltage value in the controller.

2. An integrated circuit according to claim 1, wherein the adjustable voltage source includes a plurality of resistors coupled in series to a reference voltage, wherein the reference voltage is arranged to be coupled to a power supply external to the integrated circuit, wherein a plurality of voltage taps are coupled to respective points between the resistors that allow selection of a voltage value.

3. An integrated circuit according to claim 1, wherein the adjustable voltage source includes one or more transistors and/or capacitors arranged to allow selection of a voltage value between a predetermined voltage range.

4. An integrated circuit according to claim 2, further comprising a voltage regulator to which an output of the plurality of voltage taps is coupled to allow the voltage regulator to be provided with the selected voltage value.

5. An integrated circuit according to claim 1, wherein the controller is arranged to include a first voltage value which for a first mode of operation of the integrated circuit corresponds to a first operating voltage value for the integrated circuit.

6. An integrated circuit according to claim 5, wherein the controller is arranged to include a second voltage value which for a second mode of operation of the integrated circuit corresponds to a second operating voltage value for the integrated circuit.

7. An integrated circuit according to claim 1, further comprising a comparator of the integrated circuit upon a determination that the voltage value measured by the control loop is below or above the predetermined voltage value.

8. An integrated circuit according to claim 1, further comprising a comparator to which an output of the plurality of voltage taps is coupled to allow the comparator to be provided with the selected voltage value.

9. An integrated circuit according to claim 7, wherein the comparator is arranged to set a signal for resetting the integrated circuit upon a determination that the voltage value measured by the control loop is below the predetermined voltage value.

10. An integrated circuit according to claim 1, wherein the control loop includes an analogue to digital converter.

11. An integrated circuit according to claim 10, wherein the control loop further includes a processor for analysing data provided by the analogue to digital converter to determine a voltage value of a voltage sensing point to which the analogue to digital converter is coupled to.

12. An integrated circuit according to claim 11, wherein the processor is arranged to be provided with data generated externally to the integrated circuit.

13. An integrated circuit according to claim 11, wherein the voltage sensing point is formed on an output of the plurality of voltage taps.

14. An integrated circuit according to claim 11, wherein the voltage sensing point is formed on an output of the voltage regulator.

15. An integrated circuit according to claim 11, wherein the selected voltage value is selected based upon a determination as to whether the voltage value measured by the control loop is within a predetermined voltage range.

16. A method for selecting a voltage in an integrated circuit having an adjustable voltage source that are arranged to allow a plurality of voltage values to be selected, the method comprising:

measuring, by a control loop, a voltage value derived from the adjustable voltage source;

setting, by a controller, one of a plurality of switches of the adjustable voltage source based upon the measured voltage value and a second selected voltage value; and configuring, by the controller, the adjustable voltage source to provide a first selected voltage value in response to setting the one of the plurality of switches, wherein the first selected voltage value is selected based upon the measured voltage value and the second selected voltage value.

17. The method of claim 16, further comprising:

resetting the integrated circuit upon a determination that the measured voltage value is below or above a predetermined voltage value.

18. An integrated circuit according to claim 2, wherein the adjustable voltage source includes one or more transistors and/or capacitors arranged to allow selection of a voltage value between a predetermined voltage range.

19. An integrated circuit according to claim 2, wherein the controller is arranged to include a second voltage value which for a second mode of operation of the integrated circuit corresponds to a second operating voltage value for the integrated circuit.

20. An integrated circuit according to claim 2, wherein the control loop includes an analogue to digital converter.

* * * * *